(12) United States Patent
Cowley

(10) Patent No.: US 6,968,173 B2
(45) Date of Patent: Nov. 22, 2005

(54) TUNER

(75) Inventor: Nicholas Paul Cowley, Wroughton (GB)

(73) Assignee: Zarlink Semiconductor Limited (GB)

( * ) Notice: Subject to any disclaimer, the term of this patent is extended or adjusted under 35 U.S.C. 154(b) by 471 days.

(21) Appl. No.: 10/195,586

(22) Filed: Jul. 15, 2002

(65) Prior Publication Data

US 2003/0017817 A1 Jan. 23, 2003

(30) Foreign Application Priority Data

Jul. 19, 2001 (GB) .............................. 0117578

(51) Int. Cl.$^7$ ................................. H04B 1/26
(52) U.S. Cl. ................. 455/323; 455/311; 455/340; 455/266
(58) Field of Search ................. 455/323, 311, 455/312, 313, 316, 318, 319, 334, 339, 340, 266, 192.1, 192.2, 255, 257, 259, 260, 265; 334/26, 42, 59

(56) References Cited

U.S. PATENT DOCUMENTS 4,524,389 A * 6/1985 Isobe et al. ................. 348/725
5,283,532 A    2/1994 Burkhart et al. ............ 329/360
6,795,128 B2 * 9/2004 Yamamoto .................. 348/729

FOREIGN PATENT DOCUMENTS

| EP | 0863623 | 9/1998 |
|---|---|---|
| GB | 2101432 | 1/1983 |
| GB | 2270223 | 3/1994 |
| GB | 2294602 | 5/1996 |
| GB | 2335100 | 9/1999 |
| WO | 95/30283 | 11/1995 |
| WO | 99/59256 | 11/1999 |

* cited by examiner

Primary Examiner—Edward F. Urban
Assistant Examiner—Thuan T. Nguyen
(74) Attorney, Agent, or Firm—Thompson Hine LLP

(57) ABSTRACT

A tuner comprises a frequency changer which converts an input signal to a predetermined fixed intermediate frequency. The frequency changer is followed by an IF filter having a filter parameter, such as center frequency, which is electronically adjustable. A controller adjusts the adjustable filter characteristic so as to achieve a predetermined desired filtering performance, such as ensuring that the filter center frequency corresponds to the desired intermediate frequency. The controller comprises a local oscillator having the same type of tuned circuit as the IF filter. A phase locked loop compares the local oscillator frequency with a reference frequency and controls the tuned circuits of the IF filter and the local oscillator.

30 Claims, 5 Drawing Sheets

TUNER

TECHNICAL FIELD

The present invention relates to a tuner for converting a radio frequency channel to an intermediate frequency signal for demodulation. Such a tuner may be used to select a channel for reception from terrestrial or satellite broadcast signals or from a cable distribution network.

BACKGROUND

Cable tuners are required to receive a selected channel and convert this to an output intermediate frequency with a minimum signal to noise plus intermodulation level as determined by the type of modulation of the received signal. FIG. 1 of the accompanying drawings illustrates a typical dual conversion cable tuner in which all channel filtering is performed by filters having fixed frequency and bandwidth characteristics. The tuner has an antennae input 1 which receives a broadband radio frequency signal comprising a plurality of channels from a cable distribution network. Little or no filtering is performed on the broadband signal and, in particular, there are no filters with continuously variable bandwidth or centre frequency.

The input 1 is connected to an automatic gain control (AGC) stage 2 whose output is connected to a first frequency changer 3 which performs a block up-conversion of the received channels such that the desired channel is centred on the first high intermediate frequency. The frequency changer 3 comprises a mixer 4 and a local oscillator (LO) 5 controlled by a phase locked loop (PLL) synthesiser 6. The synthesiser 6 is in turn controlled by a controller 7, such as an I2C bus microcontroller which may be implemented as a programmed microcomputer or a state machine. The controller 7 controls the synthesiser 6 so that the local oscillator 5 supplies a signal of the appropriate frequency for converting the desired channel to the first intermediate frequency, which is typically between 1.1 and 1.3 GHz.

The output of the mixer 4 is supplied to a first intermediate frequency filter 8 of bandpass type having a centre frequency at the first intermediate frequency and a defined passband such that the filter 8 passes the desired channel and several adjacent channels to a second frequency changer 9. The second frequency changer 9 comprises a mixer 10 and a local oscillator 11 controlled by a phase locked loop synthesiser 12, which in turn is controlled by the controller 7. The frequency changer 9 performs a down-conversion of the signals received from the filter 8 such that the desired channel is centred on the second intermediate frequency, which is typically between 30 and 50 MHz. The output of the mixer 10 is supplied to a second intermediate frequency filter 13 of bandpass type having a centre frequency at the second intermediate frequency and, typically, a shaped passband characteristic so as to pass the desired channel at the second intermediate frequency and to reject the adjacent channels. The output of the filter 13 is connected to an intermediate frequency amplifier 14 whose output is connected to the intermediate frequency (IF) output 15 of the tuner. The output 15 is connected to an appropriate demodulator (not shown) for recovering the modulation signal. The passband of the filter 13 may be shaped in accordance with the modulation standard of the received signal.

In order to reduce the cost of manufacture, it is desirable to embody as much of the cable turner as possible in an integrated circuit. However, it has not been possible to integrate the filters 8 and 13 into such an integrated circuit because it has not been possible to provide such filters with accurate and repeatable passband and centre frequency characteristics. Also, in the case of tuners embodied as one or more integrated circuits with discrete component filters 8 and 10, the presence of two fixed filters constitutes a substantial portion of the cost of the tuner. Thus, such tuners are too expensive for use in many low cost systems, such as terrestrial analogue receivers and cable modems, which are extremely cost sensitive.

GB 2 335 100 discloses a transceiver including a receiver of the double conversion zero intermediate frequency type. The receiver has a first intermediate frequency filter in the form of a voltage controlled bandpass filter because of the zero intermediate frequency mode of operation, the local oscillator of the second frequency changer is at the middle of the channel selected for reception following conversion in the first frequency changer. The centre frequency of the first intermediate frequency filter is controlled by a phase locked loop having a phase sensitive detector which compares the output of the second local oscillator with a second local oscillator signal leaking back through the first intermediate frequency filter. The filter is controlled so as to remove any phase difference so that the passband is then centred on the frequency of the second local oscillator and hence at the centre of the channel selected for reception.

GB 2 294 602 discloses a cellular telephone of double conversion type in which a second local oscillator is phase-locked to the received signal during the normal reception mode. The telephone has second intermediate frequency filters in the form of low pass filters with a cut-off frequency which is switched to give a narrower passband when the telephone is in a scanning mode.

GB 2 270 223 discloses a receiver which provides periodic calibration of a voltage controlled intermediate frequency filter. An externally generated reference signal is modulated by frequency-modulating the local oscillator signal to the mixer. Signal strength measurements are used as the basis for adjusting the intermediate frequency filter to provide maximum sensitivity while rejecting adjacent channels as much as possible.

GB 2 101 432 discloses an FM (frequency modulation) receiver having a phase locked loop demodulator. The phase locked loop has a loop filter whose bandwidth is switched according to the received signal strength.

EP 0 863 623 discloses the use of an intermediate frequency filter in the form of a gyrator. The output of the filter is supplied to a frequency discriminator, which controls the filter so that its centre frequency tracks changes in the centre frequency of the signal supplied to the filter so as to compensate for frequency drifting resulting from changes in temperature in respect of the signal supplied to the filter.

WO 99/59256 discloses an AM (amplitude modulation) receiver formed as a single integrated circuit. The receiver has intermediate frequency filtering characteristics which are adjustable and are determined by a phase locked loop arrangement.

SUMMARY

According to the invention, there is provided a tuner comprising a frequency changer for converting an input signal to a predetermined fixed intermediate frequency, an intermediate frequency filter for filtering the converted input signal and having at least one electronically adjustable filter characteristic, and a controller for adjusting the at least one adjustable characteristic to achieve a predetermined filtering performance, characterised in that the intermediate frequency filter comprises a first tuned circuit having a first electronically adjustable component for adjusting the at least one filtering characteristic and the controller comprises: a local oscillator having a second tuned circuit for determining the frequency of oscillation of the local oscillator, the second tuned circuit having the same circuit as the first tuned circuit and having a second electronically adjustable component of the same type as the first electronically adjustable component; and a phase locked loop for comparing the frequency of oscillation of the local oscillator with a reference frequency to generate a control signal for controlling the first and second electronically adjustable components.

The controller may be arranged to adjust the at least one adjustable characteristic once, for example during manufacture of the tuner. As an alternative, the controller may be arranged to adjust the at least one adjustable characteristic periodically, for example each time power is applied to the tuner. As a further alternative, the controller may be arranged to adjust the at least one adjustable characteristic continuously.

The tuner may comprise at least one further frequency changer. The tuner may comprise at least one further intermediate frequency filter. The at least one further filter may have at least one electronically adjustable filtering characteristic and the controller may be arranged to adjust the at least one adjustable characteristic of the at least one further filter to achieve a further predetermined filtering performance.

The intermediate frequency filter may comprise a bandpass filter. The predetermined filtering performance may comprise the centre frequency of the bandpass filter and/or the passband width of the bandpass filter.

The phase locked loop may be arranged to lock the frequency of oscillation of the local oscillator to the intermediate frequency.

The at least one first tuned circuit may comprise a plurality of first tuned circuits. The phase locked loop may be arranged to supply the control signal to the second tuned circuit and the sum of the control signal and a respective offset to each of the first tuned circuits.

It is thus possible to provide a tuner having one or more intermediate frequency filters which are automatically aligned without requiring manual adjustment during manufacture or subsequently. Electronically adjustable filters can be readily formed in an integrated circuit and do not require accurate and repeatable characteristics because of the self-alignment performed by the tuner. It is therefore possible to embody a whole tuner, including the filtering, within a single monolithically integrated circuit. Alternatively, in the case of tuners implemented in one or more integrated circuits with discrete filters, relatively inexpensive filters can be provided, thus reducing the cost of manufacture of such a tuner to a level where it may be used in highly cost-sensitive applications.

BRIEF DESCRIPTION OF THE DRAWINGS

Like reference numerals refer to like parts throughout the drawings.

DETAILED DESCRIPTION

Figure 1:
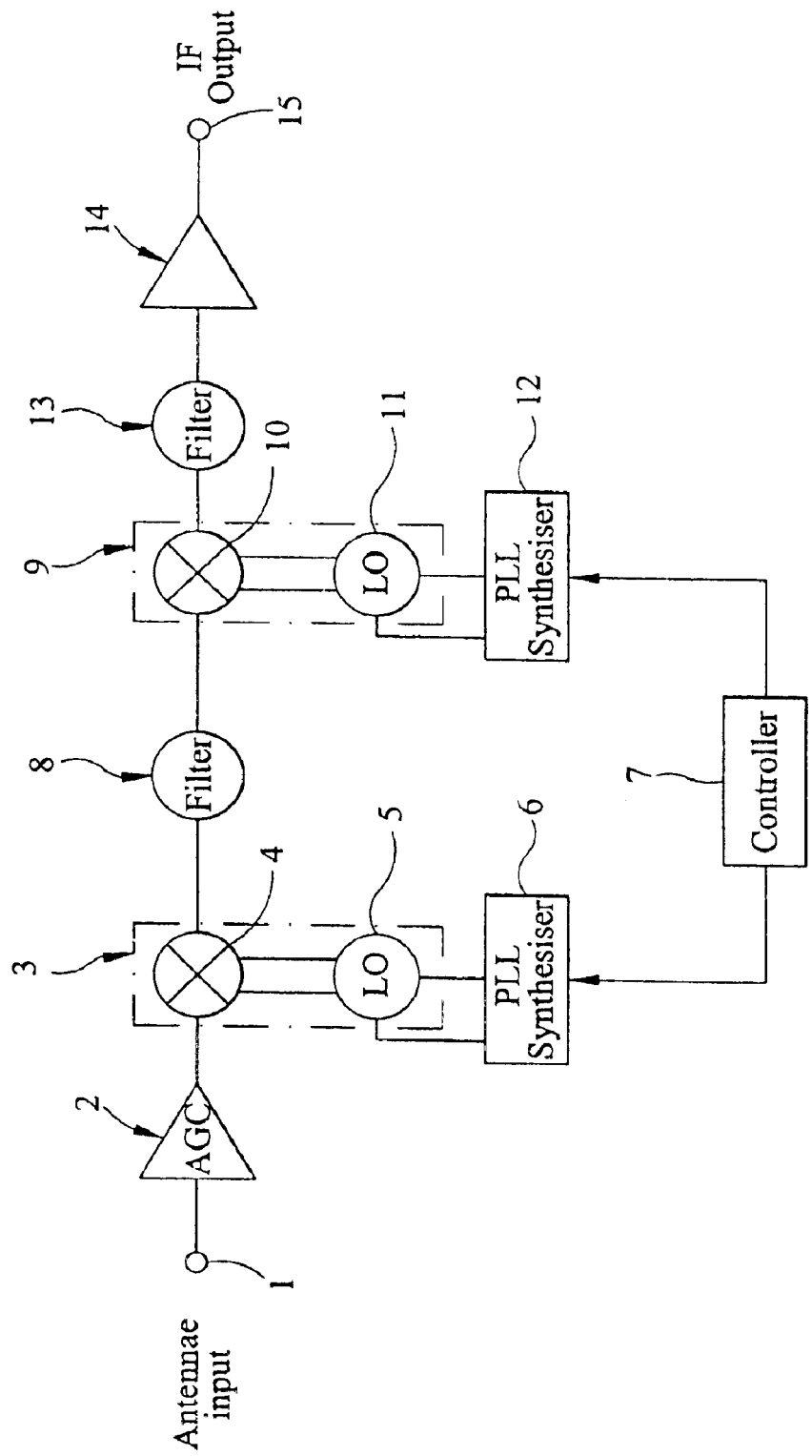
FIG. 1 is a block circuit diagram of a known dual conversion cable tuner.
Figure 2:
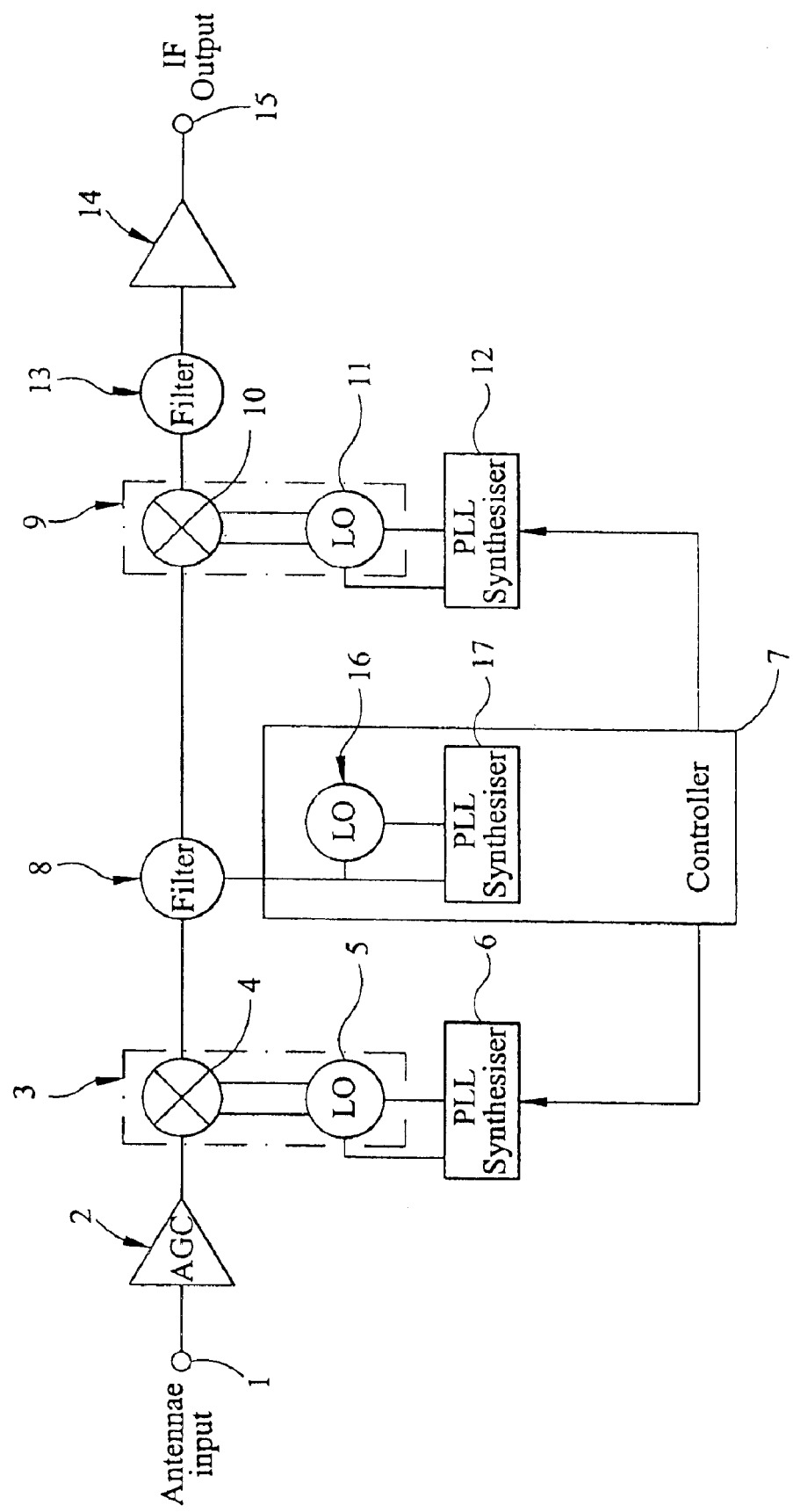
FIG. 2 is a block circuit diagram of a cable tuner constituting a first embodiment of the invention.

The tuner shown in FIG. 2 is of the dual conversion type and is similar to that shown in FIG. 1. Accordingly, only the differences between the tuners shown in FIGS. 1 and 2 will be described in detail.

In the tuner shown in FIG. 2, the first intermediate frequency filter 8 is embodied as a bandpass filter whose centre frequency is electronically adjustable. For example, the filter 8 may be embodied as one or more tuned circuits comprising a parallel-resonant circuit of an inductor and a voltage-dependent capacitor such as a variable capacitance diode or varactor. As an alternative to a voltage-dependent capacitor, an array of capacitors which are electronically switchable into circuit may be provided.

The controller 7 shown in FIG. 2 performs the same functions as that shown in FIG. 1, but in addition controls an automatic alignment procedure of the filter 8. The controller 7 thus additionally comprises a local oscillator 16 controlled by another phase locked loop synthesiser 17. The synthesisers 6, 12 and 17 may, for example, share a common frequency standard, such as a crystal-controlled oscillator.

The local oscillator 16 comprises a tuned circuit whose resonant frequency is voltage-controlled by the synthesiser 17. The tuned circuit controlling the frequency of oscillation of the oscillator 16 is substantially identical to the tuned circuit forming the filter 8. Both filters may be formed in an integrated circuit embodying the tuner and, although the actual centre frequencies of the tuner circuits are subject to large manufacturing tolerances, the manufacturing process ensures that both tuned circuits have substantially the same resonant frequency throughout at least part of their frequency control ranges. Thus, the tuned circuit forming the filter 8 has substantially the same centre frequency as the tuned circuit controlling the oscillation frequency of the local oscillator 16.

The automatic alignment procedure performed by the controller 7 may be performed once, for example during manufacture of the tuner. In such a case, the voltage for aligning the filter 8 to the required intermediate frequency may be stored within the integrated circuit in a non-volatile manner so that the correct voltage is always applied to the filter 8 during subsequent use of the tuner. The voltage may be stored as a digital code which is supplied to a digital-to-analogue converter during use of the tuner.

Alternatively, the alignment procedure may be performed periodically by the controller 7, for example each time power is applied to the tuner, so as to ensure that the tuner remains in alignment during normal use. Again, once the alignment procedure has been completed, the voltage supplied to the filter 8 for controlling its centre frequency may be stored until power is removed from the tuner.

As a further alternative, the controller 7 may perform the alignment procedure continuously so as to ensure that there is minimal drift in the centre frequency of the intermediate frequency filter 8 during use. This requires that the oscillator 16 and the synthesiser 17 remain powered up and operating during use of the tuner so that it is necessary to prevent interference with the normal tuner operation. By performing the alignment procedure once, or periodically, the oscillator 16 and the synthesiser 17 may be switched off during normal use of the tuner so as to avoid any possibility of interference.

During the alignment procedure, the synthesiser 17 controls the oscillator 16 so that its frequency of oscillation is substantially equal to the first intermediate frequency. The local oscillator 16 and the synthesiser 17 are within a feedback loop such that the output of the oscillator 16 is divided in frequency and compared with a stable and accurately known reference frequency, for example generated by a crystal-controlled oscillator. The synthesiser 17 varies the control voltage supplied to the oscillator 16 so as to minimize the frequency difference determined by the comparison. When the loop is locked, the control voltage supplied to the tuned circuit of the oscillator 16 is such that the oscillator 16 is held accurately at the first intermediate frequency.

The same control voltage is supplied to the tuned circuit of the filter 8 which, as described hereinbefore, has a centre frequency throughout at least part of the control range which is substantially identical to the frequency of oscillation of the oscillator 16. The filter 8 is thus accurately tuned such that its centre frequency is substantially equal to the first intermediate frequency. The centre frequency of the filter 8 does not, therefore, have to be determined accurately during manufacture and this allows the use of a filter with a wide manufacturing tolerance in its centre frequency characteristic. Such filters may readily be integrated in an integrated circuit embodying the whole tuner, or part thereof.

In the case of a tuner with a smaller degree of integration, the filter 8 and the frequency-determining tuned circuit of the oscillator 16 may be implemented outside the integrated circuit or circuits using matched components and a relatively inexpensive filter may be used.

Although the alignment procedure has been described for aligning the first intermediate frequency filter 8, a similar procedure and arrangement may be provided for automatically aligning the filter 13. As compared with the tuner shown in FIG. 1, the additional circuitry and, where appropriate, control software can readily be accommodated in an integrated circuit and adds little to the cost of the tuner. On the other hand, the ability to make use of integrated filters or relatively cheap discrete filters results in a substantial reduction in the cost of such a tuner, which is thus commercially attractive for a range of applications including cost-sensitive applications where the tuner is economically viable only if it has very low manufacturing cost. No manual alignment procedure or step is required during manufacture of the tuner so that the cost of an alignment step during manufacture is eliminated.

The tuner shown in FIG. 1 allows the centre frequency of the filter 8 to be aligned automatically. However, the filter 8 may have other characteristics which are subject to unacceptably high manufacturing tolerances and which therefore require adjustment. For example, the passband may require adjustment or alignment in order to provide an acceptable filter performance. Also, one or more notch filters may be present within the filter 8 and the or each notch filter may also require alignment.

Figure 3:
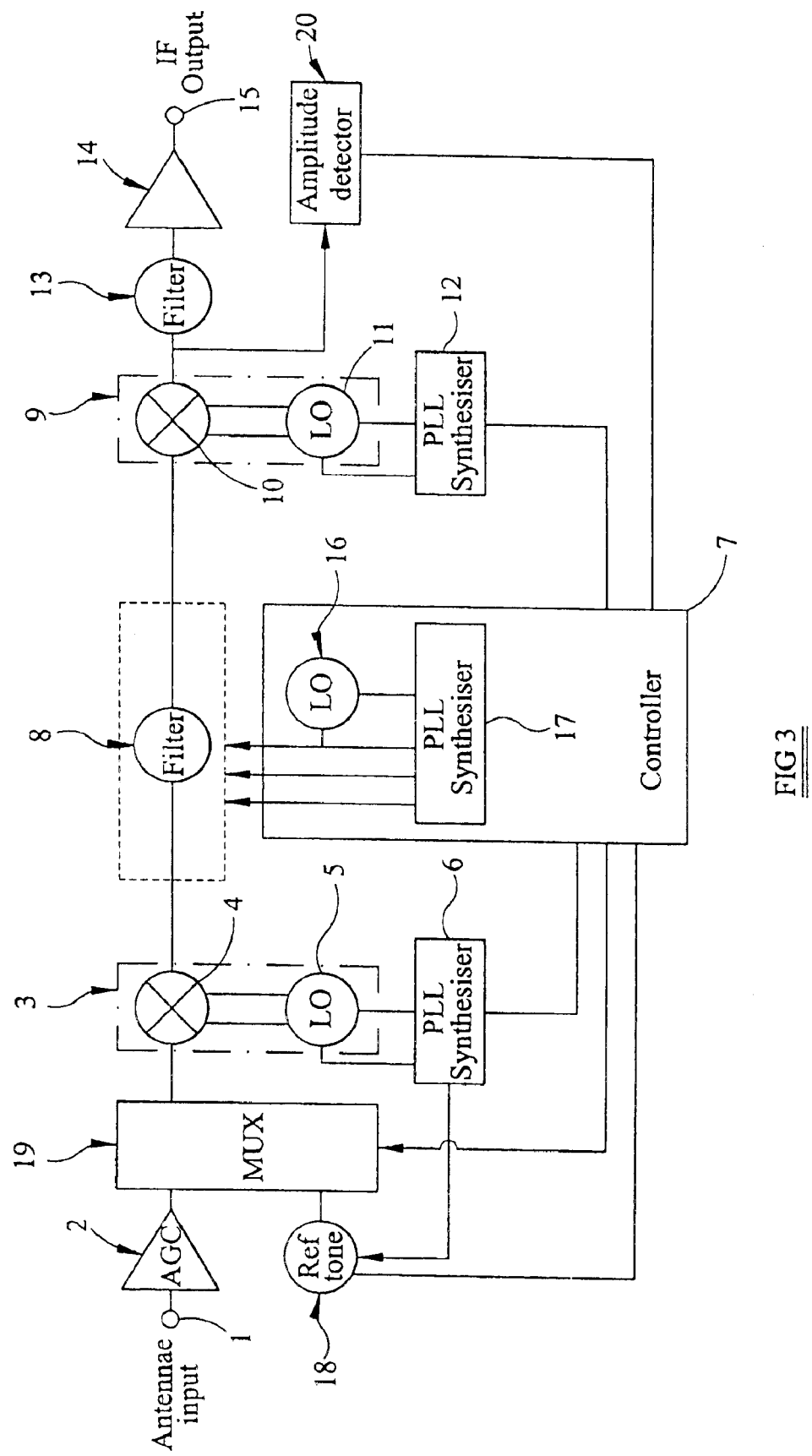
FIG. 3 is a block circuit diagram of a cable tuner constituting a second embodiment of the invention.

In order to align such a more complex filter 8, the arrangement shown in FIG. 3 may be provided. In this case, the controller 7 provides further control signals in addition to the centre frequency control signal to the filter 8. The more complicated alignment procedure for the filter 8 in FIG. 3 requires the generation of a reference tone and this is provided by a reference tone oscillator 18 which is enabled and disabled by the controller 7. The outputs of the AGC stage 2 and the oscillator 18 are connected to respective inputs of a multiplexor (MUX) 19 whose output is connected to the mixer 4 and which is controlled by the controller 7 to connect the output of the oscillator 18 to the mixer 4 during alignment of the tuner and to connect the output of the stage 2 to the mixer 3 during subsequent normal operation of the tuner. The output of the mixer 10 of the second frequency changer 9 is connected to an amplitude detector 20, whose output is connected to the controller 7.

Figure 4:
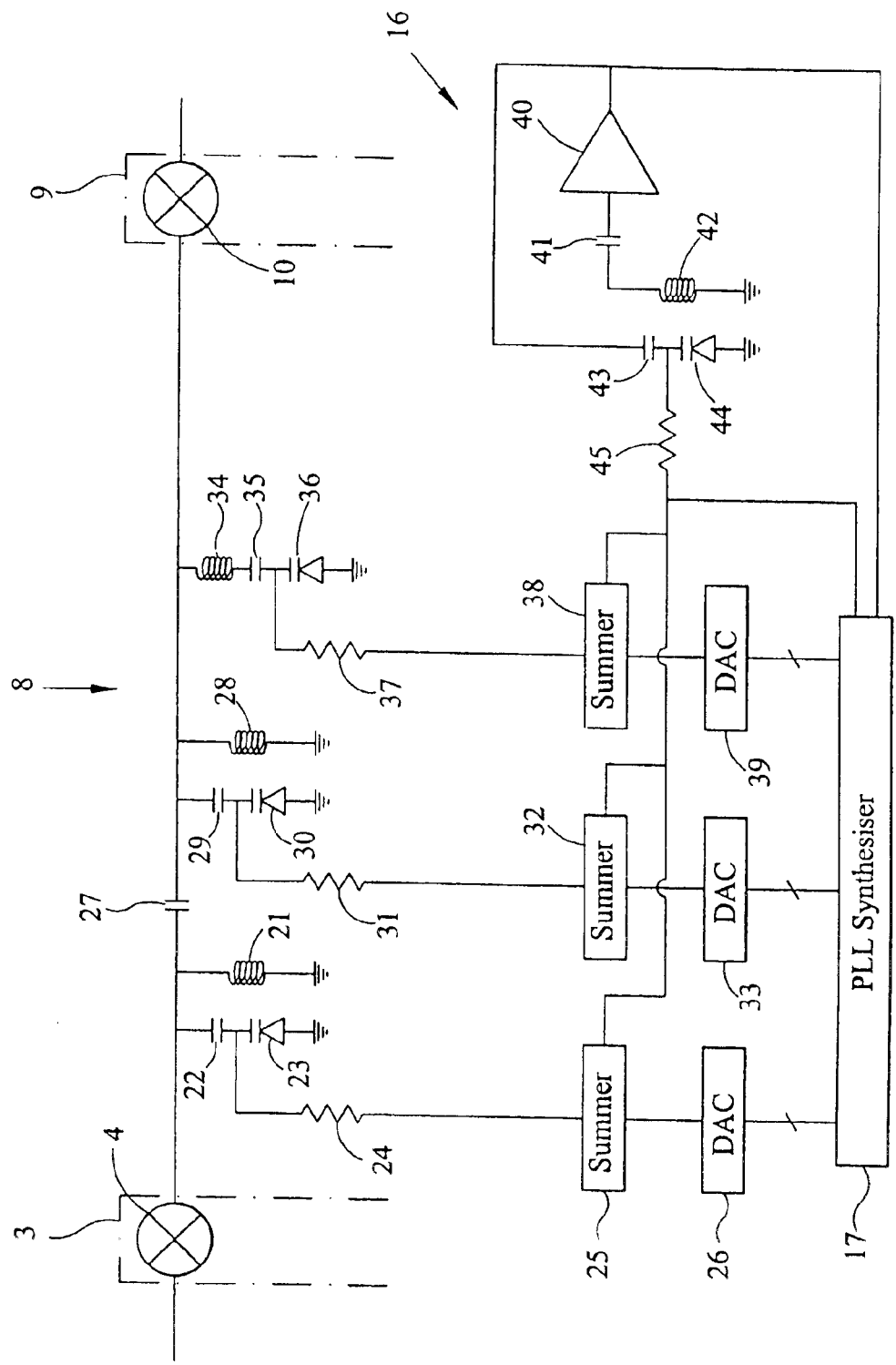
FIG. 4 is a more detailed diagram illustrating part of the tuner of FIG. 3.

FIG. 4 shows the filter 8, the local oscillator 16 and other parts of the controller 7 in more detail. The filter and the control arrangement are illustrated by way of example only and other arrangements could be used.

The filter 8 comprises two loosely coupled tuned circuits of the parallel-resonant type, each having a bandpass characteristic. In addition, a single series-resonant tuned circuit is provided to form a notch filter.

The first tuned circuit comprises an inductor 21 connected in parallel with a series circuit comprising a DC locking capacitor 22 and a variable capacitance diode 23. The connection between the capacitor 22 and the diode 23 is connected via an isolating resistor 24 to the output of a summer 25, which has a first input connected to the output of a digital-to-analogue converter (DAC) 26. The parallel input of the converter 26 is connected to an output of the synthesiser 17.

The second parallel-tuned circuit is connected to the first tuned circuit by a coupling capacitor 27 and comprises an inductor 28 in parallel with a series circuit comprising a DC blocking capacitor 29 and a variable capacitance diode 30. The connection between the capacitor 29 and the diode 30 is connected via an isolating resister 31 to the output of a summer 32 having an input connected to an output of a DAC 33. The parallel digital input of the DAC 33 is connected to another output of the synthesiser 17.

The notch filter comprises an inductor 34, a DC blocking capacitor 35 and a variable capacitance diode 36 connected in series between the input of the mixer 10 and ground. The connection between the capacitor 35 and the diode 36 is connected via an isolating resister 37 to the output of a summer 38 having an input connected to the output of a DAC 39. The parallel digital input of the DAC 39 is connected to another output of the synthesiser 17.

The local oscillator 16 comprises an inverting amplifier 40 whose input is connected via a coupling capacitor 41 to a tuned circuit of the same type as the tuned circuits providing the bandpass characteristic of the filter 8. The tuned circuit comprises an inductor 42 connected in parallel with a series circuit comprising a DC blocking capacitor 43 and a variable capacitance diode 44. The connection between the capacitor 43 and the diode 44 is connected via an isolating resistor 45 to another output of the synthesiser 17, which is connected to second inputs of the summers 25, 32 and 38. The output of the amplifier 40 is connected to the tuned circuit so as to provide positive feedback for sustaining oscillation and to an input of the synthesiser 17.

The two parallel resonant tuned circuits of the filter 8 are arranged to have centre frequencies which are adjacent but spaced on other side of the passband centre frequency of the filter 8. The tuned circuit of the oscillator 16 is arranged to have a resonant frequency at the passband centre frequency of the filter 8. This may be achieved, for example, by providing substantially identical variable capacitance diodes 23, 30 and 44, substantially identical capacitors 22, 29 and 43 (or giving such capacitors very high values which are then swamped by the capacitances of the associated variable capacitance diodes), and inductances $L+\Delta L$ and $L-\Delta L$ of the inductors 21 and 28 which are slightly above and below the inductance L of the inductor 42.

In order to align the filter 8, the same procedure as described hereinbefore is initially performed. The oscillator 18 is disabled by the controller 7 and the synthesiser 17 supplies a zero code to the DACs 26 and 33 so that the variable capacitance diodes 23 and 30 receive the same voltage from the output of the synthesiser 17 as the diode 44. The synthesiser 17 supplies a relatively large "offset" to the DAC 39 so that the notch frequency of the notch filter is moved far away from the first intermediate frequency IF1 as illustrated at Fn1 in FIGS. 5 and 6 so as not to interfere with the initial alignment procedure.

As described hereinbefore, the synthesiser 17 controls the oscillator 16 such that it supplies to the diode 44 a voltage which causes the oscillator to oscillate at the first intermediate frequency IF1. The same voltage is supplied to the variable capacitance diodes 23 and 30 so that the resonant or centre frequencies of the individual tuned circuits comprising the bandpass part of the filter 8 are disposed adjacent and on either side of the first intermediate frequency IF1 as shown at F1 and F2 in FIG. 5. The correct control voltage may then be then held constant throughout subsequent operation of the tuner so as to allow the oscillator 16 and subsequently the synthesiser 17 to be disabled so as to prevent interference during normal operation of the tuner. As alternatives and as described with reference to FIG. 2, the alignment may be performed once during manufacture or continuously during operation of the timer. When the centre frequency alignment of the filter 8 has been completed, the passband characteristics or bandwidth of the filter 8 are adjusted as necessary by supplying the appropriate codes to the DACs 26 and 33 so as to achieve the correct offset between the centre frequencies of the individual tuned circuits. In order to perform this part of the alignment procedure, the oscillator 18 is enabled and the multiplexer 19 switches the input of the mixer 4 to receive the reference tone from the oscillator 18. The amplitude detector 20 is enabled so that the controller receives a signal representing the amplitude of the output signal of the mixer 10. The controller 7 controls the synthesisers 6 and 12 such that the frequency of the reference tone supplied by the oscillator is fixed at the input of the detector 20. This ensures that the frequency response of the detector 20 does not affect the alignment procedure.

The oscillator 18 may be a variable frequency oscillator or may be a fixed frequency oscillator. As shown in FIG. 3, the oscillator 18 is controlled by the synthesiser 6 so as to be phase-locked to a reference frequency within the synthesiser 6. This ensures that the frequency of oscillation of the oscillator is stable and known.

The controller 7 controls the synthesisers 6 and 12 and, where appropriate, the oscillator 18 so as to provide a test signal of suitable frequency to the input of the filter 8. The controller 7 then causes the synthesiser 17 to vary the code supplied to the DACs 26 and 33, one at a time or simultaneously, in order to adjust the offsets of the centre frequencies of the parallel—resonant tuned circuits of the filter 8. The amplitude of the filter signal is detected by the detector 20 and supplied to the controller 7, which varies the tuned circuit offsets until the desired passband performance of the filter 8 is achieved. The actual details of how this passband alignment procedure is performed may be varied and are readily determined by a person skilled in the art. In one example, the input signal to the filter 8 may be swept so as to determine the whole passband characteristic of the filter 8 and the offsets supplied to the DACs 26 and 33 may be adjusted until the desired characteristic is obtained. The offsets may be stored so as to remain available during normal operation of the tuner.

Figure 5:
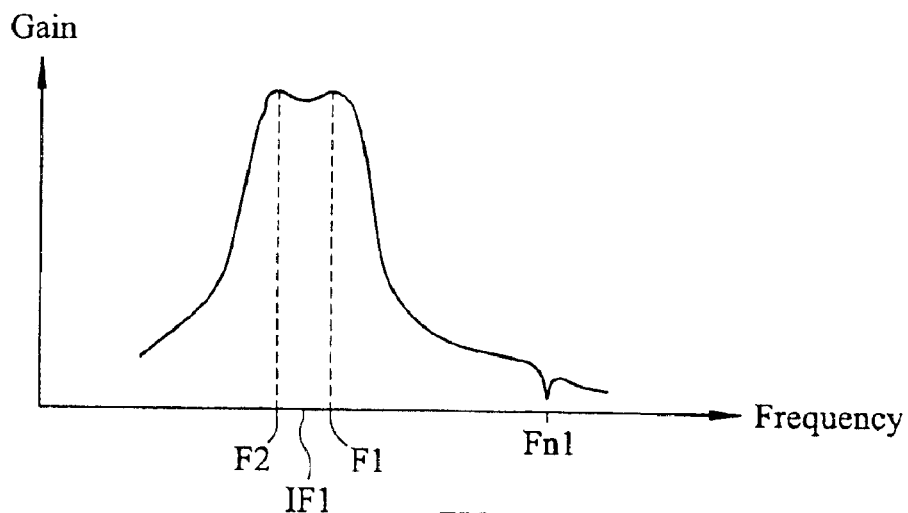
FIGS. 5 to 7 are graphs having arbitrary gain and frequency scales illustrating filter performance during several stages in the automatic alignment of the tuner of FIG. 3.
Figure 6:
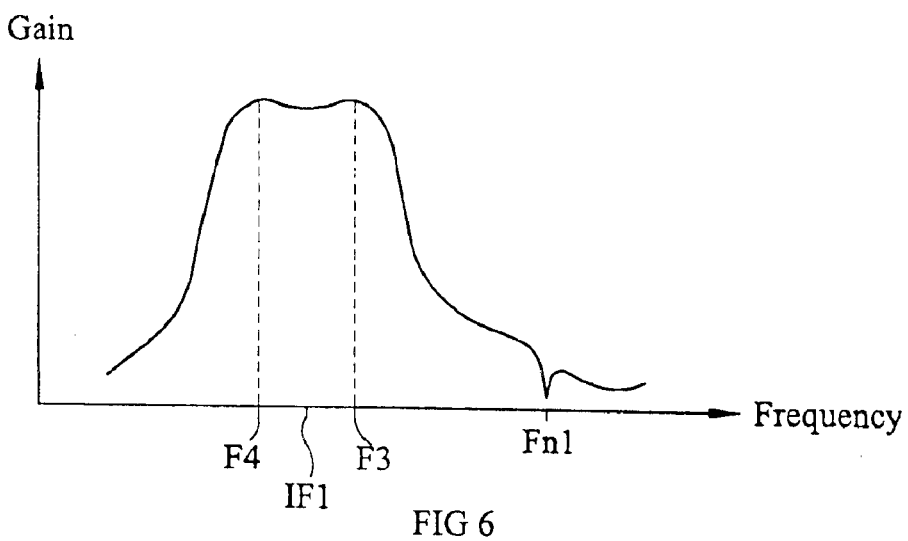

FIG. 6 illustrates the effect of this part of the alignment procedure. The passband characteristic shown in FIG. 5 is narrower than the desired characteristic and the offsets are adjusted until the characteristic shown in FIG. 6 is achieved. The individual tuned circuits thus have individual centre frequencies illustrated at F3 and F4 in FIG. 6 so as to provide the desired passband characteristic centred on the first intermediate frequency IF1.

Figure 7:
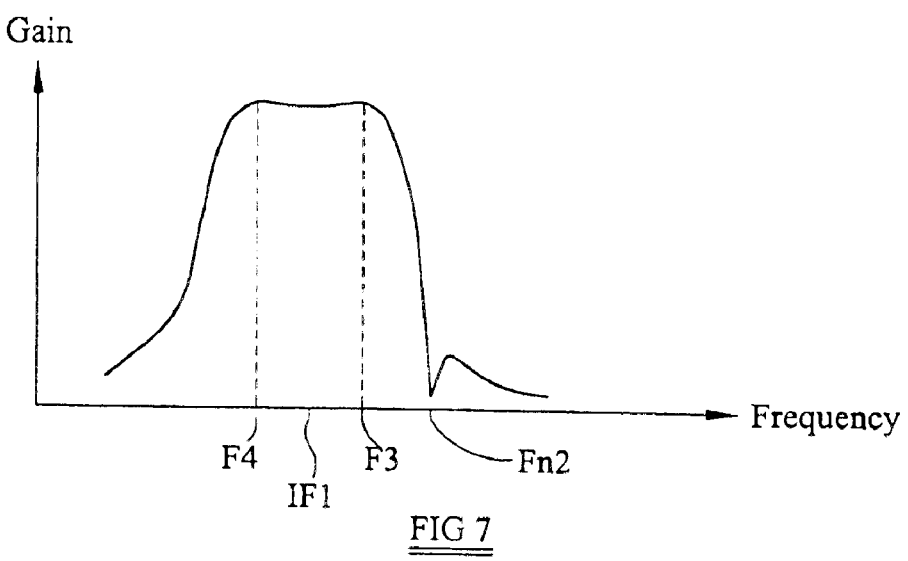

The final part of the alignment procedure for the filter shown in FIG. 4 is required to adjust the centre or notch frequency of the notch filter comprising the inductor 34, the capacitor 35 and the variable capacitance diode 36. Again, the reference tone oscillator 18 and the amplitude detector 20 are used and the code supplied to the DAC 39 is adjusted until the notch frequency has the desired value as illustrated at Fn2 in FIG. 7. The appropriate value for the notch frequency is then stored for subsequent use and this completes the alignment procedure of the filter 8, which therefore has the desired characteristic as illustrated in FIG. 7. The oscillator 18 and the detector 20 are disabled and the multiplexor 19 connects the output of the AGC stage 2 to the input of the mixer 4 for normal operation of the tuner.

A similar procedure may be used for the second intermediate frequency filter 13 as will be readily understood by a person skilled in the art.

It is thus possible to provide a tuner which employs one or more filters integrated in an integrated circuit, or one or more discrete filters having characteristics which vary, for example due to manufacturing tolerances. The tuner can automatically align such filters without manual intervention and without requiring a specific alignment step during manufacture. In those cases where alignment is repeated or performed at least in part continuously, the tuner may be maintained in alignment and the effects of component value drift with ageing or temperature variations can be eliminated or greatly reduced. A fully integrated tuner or a tuner with discrete filters can therefore be provided at relatively low cost. Such tuners are therefore suitable for use in applications where low cost is essential for commercial reasons.

Although the filters shown in the embodiments are illustrated as being connected in single-ended fashion, the filters may be connected differentially where the associated stages of the tuner have differential inputs and outputs.

What is claimed is:

1. A tuner comprising a frequency changer for converting an input signal to an output signal of a predetermined fixed intermediate frequency, an intermediate frequency filter for filtering said output signal and having at least one electronically adjustable filtering characteristic, and a controller for adjusting said at least one adjustable characteristic to achieve a predetermined filtering performance, wherein said intermediate frequency filter comprises at least one first tuned circuit having a first electronically adjustable component for adjusting said at least one filtering characteristic, and wherein said controller comprises: a local oscillator having a second tuned circuit for determining a frequency of oscillation of said local oscillator, said second tuned circuit having a same circuit as said at least one first tuned circuit and having a second electronically adjustable component of a same type as said first electronically adjustable component; and a phase locked loop for comparing said frequency of oscillation of said local oscillator with a reference frequency to generate a control signal for controlling said first and second electronically adjustable components.

2. A tuner as claimed in claim 1, in which said controller is arranged to adjust said at least one adjustable characteristic once.

3. A tuner as claimed in claim 2, in which said controller is arranged to adjust said at least one adjustable characteristic during manufacture of said tuner.

4. A tuner as claimed in claim 1, in which said controller is arranged to adjust said at least one adjustable characteristic periodically.

5. A tuner as claimed in claim 4, in which said controller is arranged to adjust said at least one adjustable characteristic each time power is applied to said tuner.

6. A tuner as claimed in claim 1, in which said controller is arranged to adjust said at least one adjustable characteristic continuously.

7. A tuner as claimed in claim 1, comprising at least one further frequency changer.

8. A tuner as claimed in claim 7, comprising at least one further intermediate frequency filter.

9. A tuner as claimed in claim 8, in which said at least one further filter has at least one electronically adjustable filtering characteristic and said controller is arranged to adjust said at least one adjustable characteristic of said at least one further filter to achieve a further predetermined filtering performance.

10. A tuner as claimed in claim 1, in which said intermediate frequency filter comprises a bandpass filter.

11. A tuner as claimed in claim 10, in which said predetermined filtering performance comprises a centre frequency of said bandpass filter.

12. A tuner as claimed in claim 10, in which said predetermined filtering performance comprises a passband width of said bandpass filter.

13. A tuner as claimed in claim 1, in which said phase locked loop is arranged to lock said frequency of oscillation of said local oscillator to said intermediate frequency.

14. A tuner as claimed in claim 1, in which said at least one first tuned circuit comprises a plurality of first tuned circuits.

15. A tuner as claimed in claim 1, in which said phase locked loop is arranged to supply said control signal to said second tuned circuit and a sum of said control signal and a respective offset to each of said first tuned circuits.

16. A tuner comprising:
  a frequency changer comprising a mixer and a first local oscillator arranged to select a channel of a multichannel input signal and convert said selected channel to an output signal of a predetermined fixed intermediate frequency;
  an intermediate frequency filter for filtering said output signal and having at least one electronically adjustable filtering characteristic; and
  a controller for adjusting said at least one adjustable characteristic to achieve a predetermined filtering performance,
  wherein said intermediate frequency filter comprises at least one first tuned circuit having a first electronically adjustable component for adjusting said at least one filtering characteristic, and wherein said controller comprises a second local oscillator having a second tuned circuit for determining a frequency of oscillation of said second local oscillator, said second tuned circuit having a same circuit as said at least one first tuned circuit and having a second electronically adjustable component of a same type as said first electronically adjustable component, and a phase locked loop for comparing said frequency of oscillation of said second local oscillator with a reference frequency to generate a control signal for controlling said first and second electronically adjustable components.

17. A tuner as claimed in claim 16, in which said controller is arranged to adjust said at least one adjustable characteristic once.

18. A tuner as claimed in claim 17, in which said controller is arranged to adjust said at least one adjustable characteristic during manufacture of said tuner.

19. A tuner as claimed in claim 16, in which said controller is arranged to adjust said at least one adjustable characteristic periodically.

20. A tuner as claimed in claim 19, in which said controller is arranged to adjust said at least one adjustable characteristic each time power is applied to said tuner.

21. A tuner as claimed in claim 16, in which said controller is arranged to adjust said at least one adjustable characteristic continuously.

22. A tuner as claimed in claim 16, comprising at least one further frequency changer.

23. A tuner as claimed in claim 22, comprising at least one further intermediate frequency filter.

24. A tuner as claimed in claim 23, in which said at least one further filter has at least one electronically adjustable filtering characteristic and said controller is arranged to adjust said at least one adjustable characteristic of said at least one further filter to achieve a further predetermined filtering performance.

25. A tuner as claimed in claim 16, in which said intermediate frequency filter comprises a bandpass filter.

26. A tuner as claimed in claim 25, in which said predetermined filtering performance comprises a centre frequency of said bandpass filter.

27. A tuner as claimed in claim 25, in which said predetermined filtering performace comprises a passband width of said bandpass filter.

28. A tuner as claimed in claim 16, in which said phase locked loop is arranged to lock said frequency of oscillation of said second local oscillator to said intermediate frequency.

29. A tuner as claimed in claim 16, in which said at least one first tuned circuit comprises a plurality of first tuned circuits.

30. A tuner as claimed in claim 16, in which said phase locked loop is arranged to supply said control signal to said second tuned circuit and a sum of said control signal and a respective offset to each of said first tuned circuits.

* * * * *